US011665980B2

(12) United States Patent
Fogarty et al.

(10) Patent No.: US 11,665,980 B2
(45) Date of Patent: May 30, 2023

(54) PROCESSOR ELEMENT FOR QUANTUM INFORMATION PROCESSOR

(71) Applicant: QUANTUM MOTION TECHNOLOGIES LIMITED, Harrogate (GB)

(72) Inventors: Michael Fogarty, Harrogate (GB); Matthew Schormans, Harrogate (GB); John Morton, Harrogate (GB)

(73) Assignee: QUANTUM MOTION TECHNOLOGIES LIMITED, Harrogate (GB)

( * ) Notice: Subject to any disclaimer, the term of this patent is extended or adjusted under 35 U.S.C. 154(b) by 58 days.

(21) Appl. No.: 17/611,375

(22) PCT Filed: May 12, 2020

(86) PCT No.: PCT/GB2020/051152
§ 371 (c)(1),
(2) Date: Nov. 15, 2021

(87) PCT Pub. No.: WO2020/229809
PCT Pub. Date: Nov. 19, 2020

(65) Prior Publication Data
US 2022/0223779 A1    Jul. 14, 2022

(30) Foreign Application Priority Data

May 16, 2019    (GB) .................................. 1906936.8

(51) Int. Cl.
*H03K 17/92*    (2006.01)
(52) U.S. Cl.
CPC ............. *H10N 60/11* (2023.02); *H03K 17/92* (2013.01); *H10N 60/128* (2023.02)

(58) Field of Classification Search
CPC ...................................................... H03K 17/92
USPC ............................................................. 327/527
See application file for complete search history.

(56) References Cited

U.S. PATENT DOCUMENTS

2018/0226451 A1*    8/2018    Dzurak ................. H10N 60/12

FOREIGN PATENT DOCUMENTS

| EP | 3401848 A1 | 11/2018 |
|----|------------|---------|
| WO | 2007066937 A1 | 6/2007 |
| WO | 2017020095 A1 | 2/2017 |
| WO | 2017213660 A1 | 12/2017 |
| WO | 2018057016 A1 | 3/2018 |
| WO | 2018063270 A1 | 4/2018 |

* cited by examiner

*Primary Examiner* — Tomi Skibinski
(74) *Attorney, Agent, or Firm* — Fletcher Yoder, P.C.

(57) ABSTRACT

Processor elements are disclosed herein. A processor element comprises a silicon layer. The processor element further comprises a dielectric layer disposed upon and forming an interface with the silicon layer. The processor element further comprises a conductive via in contact with the dielectric layer, the conductive via comprising a metallic portion having an interface end closest to the dielectric layer and a distal end. A cross-sectional area of the interface end of the metallic portion of the conductive via is less than or equal to 100 nm by 100 nm. In use, the application of a bias potential to the distal end of the conductive via induces a quantum dot at the interface between the dielectric layer and the silicon layer, the quantum dot for confining one or more electrons or holes in the silicon layer. Methods are also described herein.

10 Claims, 4 Drawing Sheets

PROCESSOR ELEMENT FOR QUANTUM INFORMATION PROCESSOR

FOREIGN PRIORITY INFORMATION

This application claims priority to PCT application number PCT/GB2020/051152, filed May 12, 2020, which claims priority to United Kingdom patent application number 1906936.8, filed May 16, 2019.

TECHNICAL FIELD

The present disclosure relates to processor elements for use in quantum information processing. In particular, the present application relates to processor elements which use confinement regions such as quantum dots to store charge carriers for use as qubits, and which are manufacturable by complementary-metal-oxide-semiconductor manufacturing processes.

BACKGROUND

The invention described herein is, at least in part, based on quantum mechanics, quantum information and quantum computation. For the interested reader, the fundamentals are detailed in "Quantum Computation and Quantum Information" by Michael A Nielsen and Isaac L Chuang. In particular, this reference contains properties of qubits and the basics of quantum measurements in complementary bases, and provides an introduction to quantum error correction and fault-tolerant quantum computing. This reference also familiarises readers with notations conventionally used in the field of quantum physics.

A quantum computer is a device that processes quantum information, which is a generalisation of classical information (such as discrete classical bits i.e. 0's and 1's) which classical computers process. A quantum computer has the potential to be far more powerful than a classical computer for at least some processes because many operations can be performed much more efficiently.

In a computer for the processing of quantum bits, otherwise known as "qubits", each qubit can be placed in one of two states. However, due to the nature of quantum bits, they can also be placed in a superposition of these two states. If every qubit of a computer is placed in a suitable superposition of states, the overall superposition of states in the computer scales as $2^m$ where m is the number of qubits. By placing a computer in this superposition of states, quantum algorithms, such as Grover's algorithm, can be used to solve various problems much more rapidly. This can be viewed as resulting from the fact that, rather than running through each possible state sequentially, the qubits are in all possible combinations of states at the same time. While a qubit may be thought of as a classical 0, a classical 1, or a superposition of the two states, a qudit may be thought of as a 0, 1, ..., d−1 or a superposition of any of the d states.

Universal quantum computers promise a speed-up of processing times for several operations such as factoring large numbers, search algorithms, and quantum simulations, yet the progress of development of such quantum computers is hindered by the required high precision of control of the quantum states, and the difficulty in scaling up quantum computers to be able to process a large number of qubits or qudits.

The present disclosure provides processor devices, architectures and apparatuses capable of mitigating some of the problems described above.

SUMMARY

As described above, there is a long sought desire to build universal quantum computers, but many obstacles stand in the way of creating a universal quantum computer. In particular, a major obstacle to the development of quantum computers is decoherence—unintended interactions of a quantum state with the external world leads to a loss of quantum information. Quantum error correction can be used to protect quantum information from errors due to decoherence and other sources of noise. One can, in effect, construct a logical qubit from a plurality of physical qubits, such that the logical qubit can be processed with more precision than any individual physical qubit.

A second major obstacle to building quantum computers is scalability. While several competing architectures exist for implementing qubits, such as ion trap architectures and superconducting qubit architectures, it is very difficult to build devices which can sustain more than a few qubits. Many of the most-promising approaches to large scale universal quantum computing rely upon quantum error correction, in which an ideal logical qubit can be simulated by using a plurality of (noisy) physical qubits provided that the errors are below a fault-tolerance threshold. Such approaches require an architecture that can be scaled up to very large numbers of qubits. It will prove difficult to achieve a large scale quantum computer with any architectures that cannot be adequately scaled up to operate reliably with large numbers of physical qubits.

The inventors have recognised that if a quantum computing architecture can be manufactured using complementary-metal-oxide-semiconductor (CMOS) processes then there is a likelihood that such architectures can be scaled up to include many physical qubits.

The elements/architectures/designs described herein may form the basic building blocks for a spin-qubit quantum processor which can be fabricated using existing CMOS technologies, for example a 40 nm CMOS process. Such processes typically limit the materials, certain dimensions and fabrication methods used in the production of the device, but their highly developed and well-controlled nature means that complex devices can be produced with very high yield and high uniformity on a very large scale and at relatively low cost. However, due to the process restrictions, many inventive steps are required to produce suitable spin-qubit building blocks using this technology. While the principle of CMOS compatibility is often assumed, for example because of the materials used, the reality is that other complexities in the scale or patterning of the devices renders them incompatible with a standard CMOS process. For example, the small feature sizes and pitches mean some designs can only be fabricated using electron beam lithography. Patterning metal regions with only nanometres between distinct regions is extremely challenging using standard CMOS manufacturing processes. Furthermore, when attempting to fit many quantum processor elements into a small space, there are many difficulties involved in interfacing with the control electronics. In formulating the architectures described herein, the inventors have "broken" many of the standard design rules for CMOS manufacturing processes.

Localised spins in semiconductors can be used to encode elementary bits of quantum information. Silicon (Si) quantum dots (QDs) are promising candidates for the realization of spin qudits. Metallic regions, such as gates, which help to define the quantum dot structure, can be realised by patterning a metal layer on a substantially uniform thickness dielectric layer to separate the metal from the silicon semiconducting region. The quantum dots are defined through the combined electrostatic potential of several such gates. This creates problems, such as how to get signals to the many gates by fanning out metal connections from the small metal gate regions to the electrode regions for interfacing with classical control electronics. The more quantum dot regions in the processor, the larger the difficulty this presents, and so making a scalable array of thousands of quantum dots, as would be needed for a quantum computer, remains a significant challenge, and the described examples help to mitigate such problems.

According to an aspect of the invention, a processor element is provided herein. The processor element comprises a silicon layer. The processor element further comprises a dielectric layer disposed upon and forming an interface with the silicon layer. The processor element further comprises a conductive via in contact with the dielectric layer, the conductive via comprising a metallic portion having an interface end closest to the dielectric layer and a distal end. The cross-sectional area of the interface end of the metallic portion of the conductive via is less than or equal to 100 nm by 100 nm. In use, the application of a bias potential to the distal end of the conductive via induces a quantum dot at the interface between the dielectric layer and the silicon layer, the quantum dot for confining one or more electrons or holes in the silicon layer.

Conventionally, the CMOS manufacturing process flow can be divided into frontend-of-line (FEOL) and backend-of-line (BEOL) processes. Generally FEOL refers to all processes preceding salicidation (i.e. silicide formation), including the selection of the starting material (e.g. silicon wafer to be used) through to formation of source/drain regions. BEOL generally refers to all processes after salicidation. The term "salicide" is a compaction of the phrase self-aligned silicide. The salicide process involves the reaction of a thin metal film with silicon in the active regions of the device, ultimately forming a metal silicide contact through a series of annealing and/or etch processes. The salicide process typically begins with deposition of a thin transition metal layer over fully formed and patterned semiconductor devices (e.g. transistors). The wafer is heated, allowing the transition metal to react with exposed silicon in the active regions of the semiconductor device (e.g., source, drain, gate) forming a low-resistance transition metal silicide. The transition metal does not react with a silicon dioxide dielectric layer nor any silicon nitride insulators present on the wafer. Following the reaction, any remaining transition metal may typically be removed by chemical etching, leaving silicide contacts in only the active regions of the device.

In contrast, the conductive via of a processor element described herein is in contact with the dielectric layer as opposed to being in contact with a layer of salicide. Since the via is separated from the silicon by the thin oxide, rather than ohmically connected through silicide as would normally be the case, the voltage on the via can be used to form and control a quantum dot.

Throughout this specification, reference is made to directional terms such as "above" and "below", or "upper" and "lower". References made to such terms are purely indicative of relative positions of the features of embodiments disclosed herein. For example, if it is mentioned that an electrode is above a dielectric layer and a silicon layer is below the dielectric layer, then it should be understood that the electrode and silicon layer are formed on opposite sides of the dielectric layer. That is directional terms such as those described herein do not refer to a direction relative to a viewpoint of an observer, but instead should be considered in all aspects as relative terms. A "vertical" direction is intended to mean a direction through the layered structure.

The cross-sectional area of the interface end of the metallic portion of the conductive via is less than or equal to 100 nm by 100 nm. For example, the cross-sectional area may be less than or equal to 80 nm by 80 nm. For example, the cross-sectional area may be less than or equal to 60 nm by 60 nm. For example, the cross-sectional area may be around 40 nm by 40 nm.

The dielectric layer may have a thickness of less than 10 nm, for example, the dielectric layer may have a thickness of around 5 nm.

The metallic portion may comprise any suitable metal, for example tungsten.

The interface end of the metallic portion may be in contact with the dielectric layer.

The conductive via may be a wholly metallic via. For example, the via may consist of a tungsten tapered portion.

The conductive via may further comprise a polysilicon portion between the metallic portion and the dielectric layer and in contact with the dielectric layer.

The metallic portion of the conductive via may have a taper such that a cross-sectional area of the metal portion is greater at the distal end than at the interface end. For example, tapering may occur because of the etch hole being larger at the top where metal electrodes then provide horizontal connections following vertical fanout. These caps may be larger than the end that is in direct contact with or closest to the dielectric layer.

A via, also known as vertical interconnect access, is an electrical connection between layers in a physical electronic circuit that goes through the plane of one or more adjacent layers. Advantageously, by providing a conductive via having such a tapered profile in the vertical direction through the CMOS stack, one can better define the quantum dot region of the processor element while still able to control the potential using classical control apparatus. By forming quantum dots in this way, with the metallic portion of the conductive via fanning out in the vertical direction away from the interface between the silicon layer and the dielectric layer, the spatial area taken up by the processor element is reduced, and accordingly many such processor elements can be included on the same wafer during manufacture. Many more processor elements can thus be included in a small form factor.

In use, the application of a bias potential to a distal end of the conductive via may confine a single electron to the quantum dot.

The processor element may further comprise a source electrode. The processor element may further comprise a drain electrode. The processor may further comprise one or more polysilicon gate electrodes, and in particular may comprise two polysilicon gate electrodes. The quantum dot may provide a single electron transistor, SET, island.

The processor element may further comprise a second conductive via in contact with the dielectric layer, the second conductive via for comprising a second metallic portion having an interface end and a distal end. The cross-sectional area of the interface end of the second metallic portion of the conductive via may be less than or equal to 100 nm by 100 nm. In use, the application of a bias potential to the distal end of the second conductive via may induce a second quantum dot at the second interface between the dielectric layer and the silicon layer, the second quantum dot for confining one or more electrons or holes in the silicon layer.

The second metallic portion of the second conductive via may have a taper such that a cross-sectional area of the second metallic portion is greater at the distal end than at the interface end.

The quantum dot and the second quantum dot may be separated by a quantum tunnelling barrier, for example through the dielectric layer.

The second quantum dot may be for confining an electron or a hole for use as a qubit.

The interface end of the second metallic portion may be in contact with the dielectric layer.

The second conductive via may be a wholly metallic via.

The second conductive via may further comprise a second polysilicon portion between the second metallic portion and the dielectric layer and in contact with the dielectric layer.

The second metallic portion of the second conductive via may have a taper such that a cross-sectional area of the second metallic portion is greater at the distal end than at the interface end.

The interface end of the metallic portion of the conductive via may be separated from the interface end of the second metallic portion of the second conductive via by a distance of less than or equal to 60 nm. For example, the vias may be separated by a distance of less than or equal to 50 nm, less than or equal to 40 nm, less than or equal to 30 nm, or less than or equal to 20 nm. Similarly, the quantum dot and the second quantum dot may be separated by a distance of less than or equal to 60 nm. For example, the quantum dots may be separated by a distance of less than or equal to 50 nm, less than or equal to 40 nm, less than or equal to 30 nm, or less than or equal to 20 nm.

According to an aspect of the present invention, a processor is described herein, the processor comprising a plurality of processor elements as described herein.

According to an aspect of the present invention, a processor element is provided. The processor element comprises a layer of silicon material and a layer of dielectric material forming an interface with the layer of silicon material. The processor element further comprises a pair of conductive vias in contact with the dielectric layer, the pair of conductive vias each comprising a metallic portion having an interface end closest to the dielectric layer and a distal end. A cross-sectional area of the interface end of the metallic portion of each conductive via of the pair of conductive vias is less than or equal to 100 nm by 100 nm. In use, the application of bias potentials to the distal end of each conductive via of the pair of conductive vias induces a first quantum dot and a second quantum dot at the interface, the first quantum dot for use as an island of a single electron transistor, and the second quantum dot for confining a charge carrier for use as a qubit.

The metallic portion of each conductive via of the pair of conductive vias may have a taper such that a cross-sectional area of the metallic portion is greater at the distal end than at the interface end.

According to an aspect of the present invention, a method of operating a processor as described herein is provided. The processor element comprises a silicon layer. The processor element further comprises a dielectric layer disposed upon and forming an interface with the silicon layer. The processor element further comprises a conductive via in contact with the dielectric layer, the conductive via comprising a metallic portion having an interface end closest to the dielectric layer and a distal end. The cross-sectional area of the interface end of the metallic portion of the conductive via is less than or equal to 80 nm by 80 nm. The metallic portion of the conductive via has a taper such that a cross-sectional area of the metal portion is greater at the distal end than at the interface end. In use, the application of a bias potential to the distal end of the conductive via induces a quantum dot at the interface between the dielectric layer and the silicon layer, the quantum dot for confining one or more electrons or holes in the silicon layer. The method comprises applying a bias potential to a distal end of the metallic portion of the conductive via to confine a single electron or hole in the quantum dot.

The quantum dot may be a single electron transistor, SET, island, and the processor element may further comprise a second conductive via in contact with the dielectric layer, the second conductive via for defining a second quantum dot at the interface and comprising a second metallic portion, the second quantum dot for, in use, confining one or more electrons or holes in the silicon layer, the second quantum dot separated from the SET island by a tunnelling barrier. The method may further comprise applying a bias potential to a distal end of the second metallic portion of the second conductive via to confine a single electron or hole in the second quantum dot for use as a qubit.

The method may further comprise manipulating a logic state of a qubit confined within the second quantum dot by manipulating a state of electrons or holes confined in the SET island.

BRIEF DESCRIPTION OF THE FIGURES

Embodiments of the invention will now be described by way of example only, with reference to the accompanying figures, in which.

Throughout the description and the drawings, like reference numbers refer to like parts.

DETAILED DESCRIPTION

Whilst various embodiments are described below, the invention is not limited to these embodiments, and variations of these embodiments may well fall within the scope of the invention which is to be limited only by the appended claims.

Figure 1:
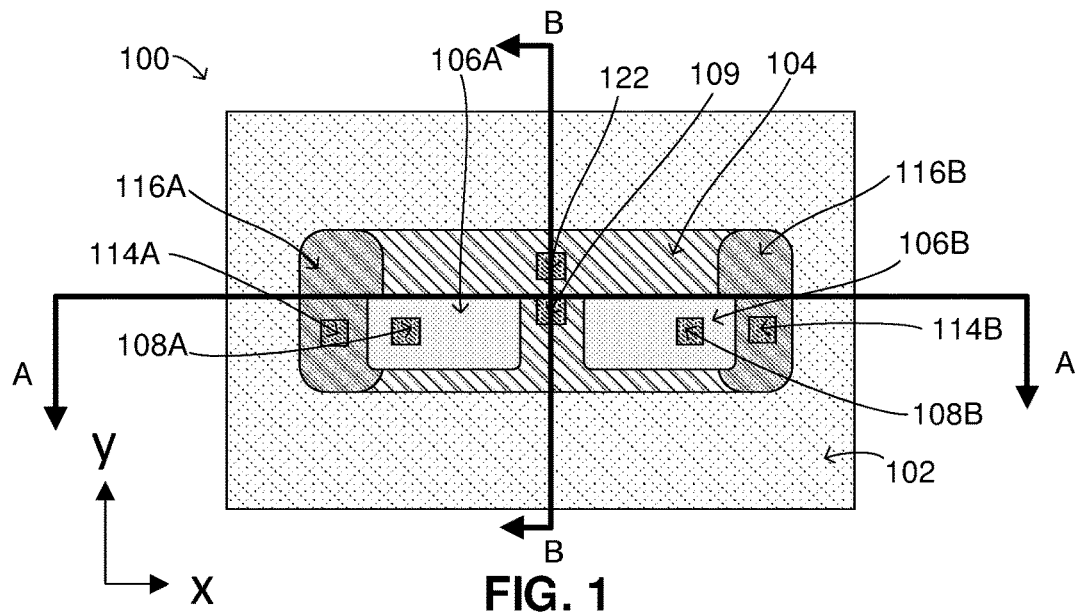
FIG. 1 illustrates a plan view of a cross-section of a processor element according to a first example.
Figure 2:
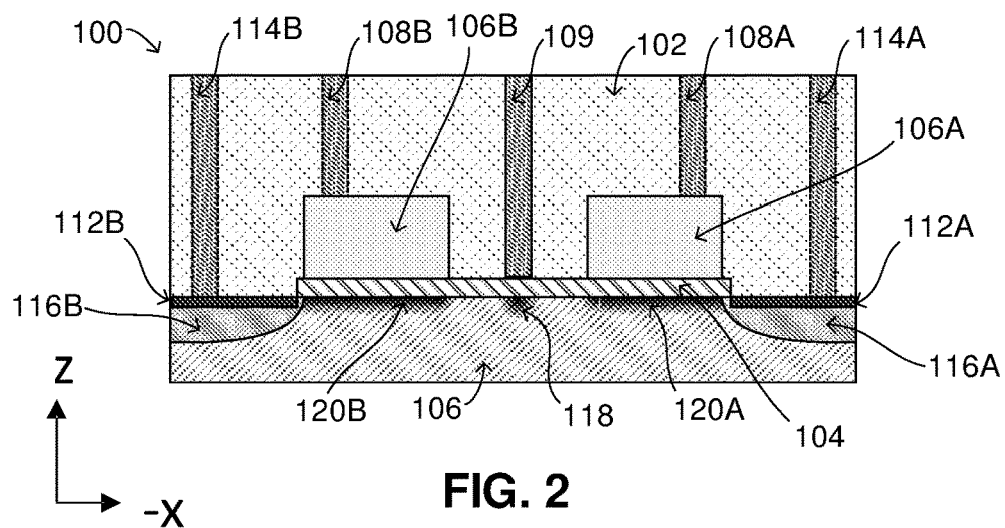
FIG. 2 illustrates a first side view of a cross-section of a processor element according to the first example.
Figure 3:
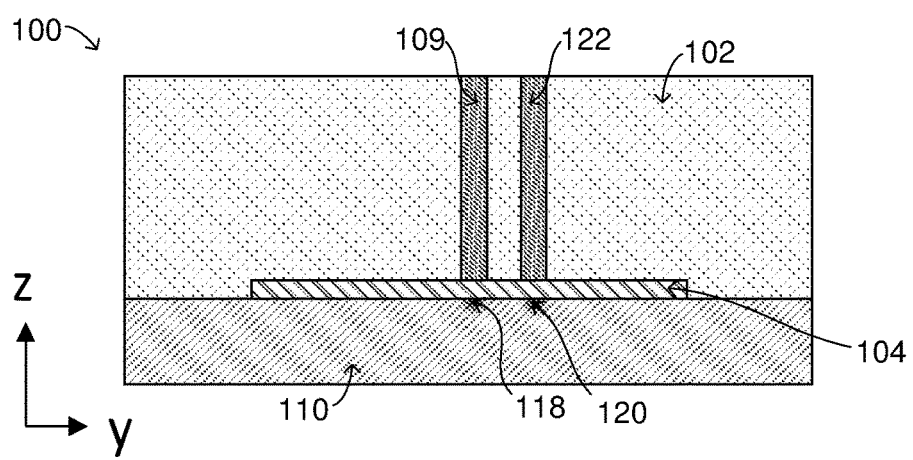
FIG. 3 illustrates a second side view of a cross-section of a processor element according to the first example.

FIGS. 1-3 illustrate a processor element 100 according to an example of the present disclosure from several different vantage points. FIG. 1 shows a cut-through view of the processor element in the x-y plane at a first height along the z-axis. That is, FIG. 1 illustrates the processor element 100 as viewed from above (plan view) at a first height within the processor element 100. FIG. 2 shows a cross-sectional view of the processor element 100 as viewed substantially along direction A (shown in FIG. 1). FIG. 3 shows a second cross-sectional view of the processor element 100 as viewed substantially along direction B (shown in FIG. 1). Features shown in dashed lines (for example features 114A, 114B, 108A and 108B of FIG. 2) are shown for indicative purposes only but are obstructed from view.

The processor element of FIGS. 1-3 may be implemented as a qubit control element for a quantum computer comprising a plurality of these processor elements. As will be explained below, in the processor element of FIGS. 1-3, charge carriers such as electrons are able to be confined in small regions of semiconductor (i.e. in a quantum dot) which can be brought into the single electron regime or the few-electron regime. The processor element of FIGS. 1-3 provides two quantum dots, one for use as an island of a single electron transistor (SET), and one for confining a charge carrier for use as a spin qubit.

With reference to the figures, the processor element 100 comprises a silicon layer 110. The silicon layer may be isotropically enriched. In this example, isotropically enriched silicon $^{28}Si$ is used. The $^{28}Si$ may be an epitaxial layer grown on a conventional silicon substrate.

The processor element 100 further comprises a metal source electrode 112A and a metal drain electrode 112B, each connected to a corresponding metal via 114A, 114B. Beneath the source electrode 112A there is an ohmic region 116A. Beneath the drain electrode 112B there is an ohmic region 116B.

A thin dielectric gate layer 104 formed of silicon dioxide ($SiO_2$) is positioned on the silicon layer 110. The dielectric layer has a thickness of approximately 5 nm in this example. Above the dielectric layer 104 is positioned a polysilicon gate electrode 106A and a polysilicon gate electrode 106B, each coupled by dedicated metal vias 108A, 108B to electrodes (not shown) in higher layers of the device. The polysilicon gate electrodes 106A, 106B are separated from each other by a distance of approximately 105 nm in this example. By applying a potential to metal vias 108A and 108B, regions of induced charge carriers 120A and 120B form in the silicon layer 110 at the interface between the silicon layer 110 and the silicon dioxide 104 beneath the polysilicon electrodes 106A, 106B.

A conductive via, in this example a metallic via 109, extends from a higher plane of the processor element 100 down to the thin dielectric layer 104. The end of the metallic via 109 in contact with the dielectric layer 104, also referred to here as the interface end of the metallic portion of the via 109, has a cross-sectional area of less than or equal to 100 nm by 100 nm. In this example, the cross-sectional area is 65 nm by 65 nm. The metallic portion of the conductive via 109 may have a taper such that a cross-sectional area of the metal portion is greater at the distal end (not shown) than at the interface end closest to the thin dielectric layer 104. Beneath the via 109, at the $Si/SiO_2$ interface, is a region in which either electrons or holes may be isolated. If a sufficiently positive potential is applied to the distal end of the via 109, then electrons will be caused to be isolated in region 118; whereas if a sufficiently negative potential is applied to the distal end of via 109, then holes will be caused to be isolated in region 118. In an example, the potentials applied to vias 108A, 108B and 108C may be sufficient to isolate a single electron in quantum dot region 118, with quantum tunnelling barriers between the quantum dot 118 and the source and drain electrodes 112A, 112B. In this way a single electron transistor (SET) is formed.

The single electron transistor accordingly comprises a SET island 118 formed in the silicon layer 110 between tunnelling junctions (in the oxide layer 104) connected to the source and the drain electrodes, the tunnelling between the SET island 118 controlled by the potentials applied to gate electrodes 106A and 106B. Through tunnelling, one can add or subtract electrons to/from the SET island 118 charging it either negatively or positively.

The presence of excess electrons at the SET island 118 affects the electrostatic energy of the system, which depends on the charging energy of the SET:

$$E_{charge} = \frac{1}{2}\frac{Q_{island}}{C}$$

where $Q_{island}$ is the charge on the island given by ne where n is the number of excess electrons and e is the charge of one electron, and C is the total capacitance of the SET island 118. The total capacitance C of the SET island 118 includes the intrinsic capacitances of the tunnelling junctions to the source and drain electrodes and the gate capacitances as controlled by the electrodes 106A and 106B.

Assuming that the potentials at electrodes 106A and 106B are substantially the same, the electrostatic energy of the $$E_{SET} = \frac{1}{2}\frac{e^2(n-n_{gate})^2}{C}$$

where $n_{gate}$ is the number of elementary gate charges. The electrostatic energy of the SET determines whether tunnelling through a junction is forbidden or allowed at a given potential difference between the source and drain electrodes. This is the Coulomb blockade effect. The drain-source voltage determines the energy of the electrons before the junction—when the voltage is higher that the Coulomb blockade, the electrons will overcome the blockade and tunnelling will occur. The height of the blockade may be determined by the number of excess electrons on the SET island 118 and the gate charge.

The processor element 100 further comprises a second conductive via 122 in contact with the dielectric layer 104, the second conductive via comprising a second metallic portion having an interface end and a distal end. The cross-sectional area of the interface end of the second metallic portion of the second conductive via is less than or equal to 80 nm by 80 nm, and in this example is also 65 nm by 65 nm. The second metallic via 122 also has a taper such that a cross-sectional area of the second metallic portion is greater at the distal end (not shown) than at the interface end.

A thick oxide material 102 (also $SiO_2$ in this example) also surrounds the various components of the processor element 100.

The first and second metallic vias 109, 122 are located close to one another, and separated, at the $SiO_2$ layer 104, by a distance of around 60 nm. In use, a potential may be applied to the distal end of the via 122 in order to confine electrons or holes in the silicon layer 110 at the interface substantially beneath the via 122. In use, a second quantum dot 120 may be formed in the silicon layer and used to confine a single electron. A single qubit may be encoded in the spin state of the isolated electron in quantum dot 120.

Accordingly, processor element 100 comprises a SET having a first quantum dot (acting as the SET island 118), and a proximally located second quantum dot 120 for confining an electron for use as a spin qubit. The SET island 118 can be manipulated in order to read out the qubit stored in quantum dot 120. The occupancies of the two quantum dots 118 and 120 are controlled by the voltages applied to vias 109, 122 and can be tuned so as to confine relatively small numbers of electrons to the quantum dots. In a simple scenario, each quantum dot 118, 120 carries a spin of S=½ when the occupancy N is odd, and a spin of S=0 when the occupancy N is even. Tunnelling between the SET island 118 and the quantum dot 120 is dependent on the Pauli spin-blockade mechanism. In particular, when the spins in the SET island 118 and the quantum dot 120 are the same, then tunnelling between the two regions is forbidden by the Pauli exclusion principle. If, on the other hand, the spins in the SET island 118 and the quantum dot 120 are not the same, then tunnelling may be enabled to occur. The difference in current flow between the source and the drain electrodes enables a user to distinguish between the two states. In particular, the total capacitance C at the SET island 118 is dependent on the state of the spin qubit held in the second quantum dot 120, and accordingly a state of the spin qubit in the second quantum dot can be determined by analysing the drain-source voltage required to overcome the electrostatic energy of the SET.

The quantum dots 118, 120 are accordingly defined by the combined electrostatic potential of all of the electronic components present (e.g. electrodes 106A, 106B) and vias 108A. 108B, 109 and 122. The tapered vias help to provide the control signals for operating the processor element 100.

The processor element 100 may be formed by any suitable manufacturing process, such as a 40 nm CMOS process. For example, a silicon layer 110 may be provided. A thick oxide layer 104 may be provided upon the silicon layer 110, and the thick oxide layer 104 may be etched so as to provide spacing for the conductive vias and electrodes, the conductive vias separated from the silicon layer 110 by a remaining thin oxide layer 104. The conducting vias and electrodes may be inserted into the spacings formed in the thick oxide layers.

Alternatively, a silicon layer 110 may be provided. Thin layers of $SiO_2$ may be deposited on the silicon layer in order to provide the thin dielectric layer 104. The conductive vias may be placed upon the thin layer 104 and then surrounded by a deposited thick $SiO_2$ layer.

Figure 4:
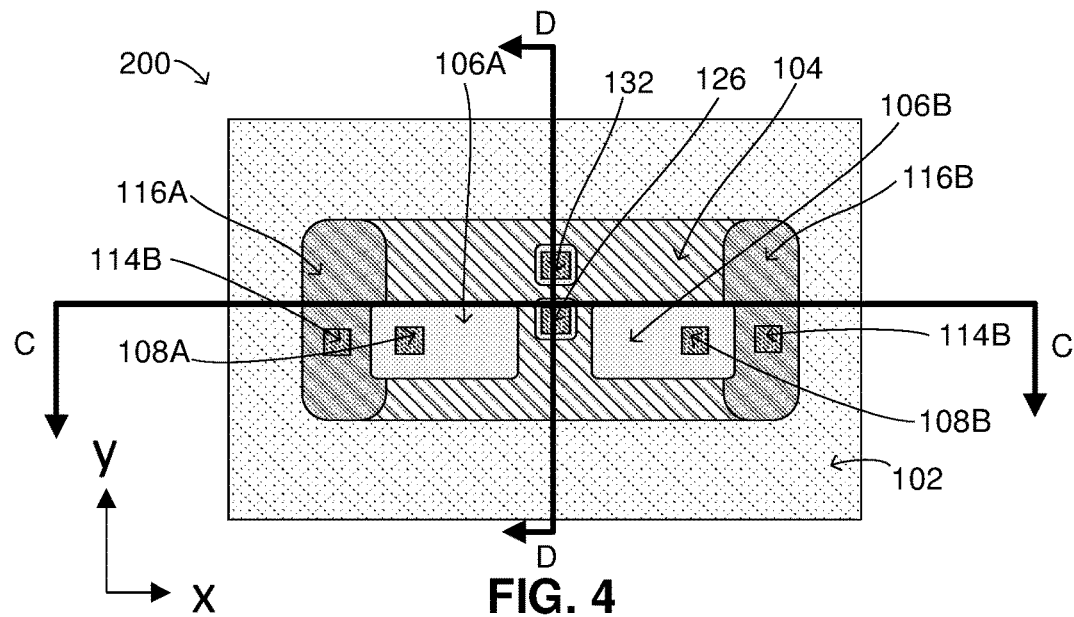
FIG. 4 illustrates a plan view of a cross-section of a processor element according to a second example.
Figure 5:
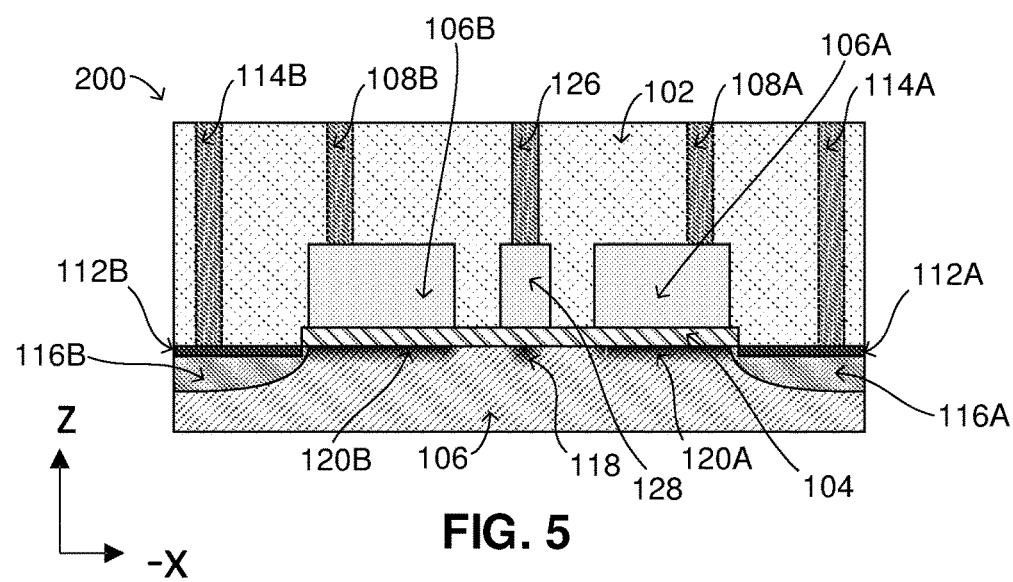
FIG. 5 illustrates a first side view of a cross-section of a processor element according to the second example.
Figure 6:
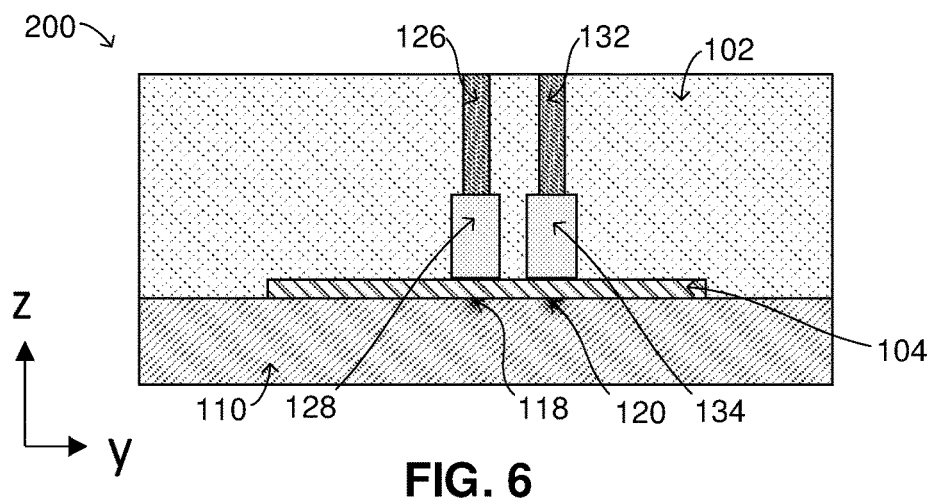
FIG. 6 illustrates a second side view of a cross-section of a processor element according to the second example.

FIGS. 4-6 illustrate a processor element 200 according to another example (not within the scope of the claims) from several different vantage points. FIG. 4 shows a cut-through view of the processor element in the x-y plane at a first height along the z-axis. That is, FIG. 4 illustrates a cross-section of the processor element 200 as viewed from above (plan view) at a first height within the processor element 200. FIG. 5 shows a cross-sectional view of the processor element 200 as viewed substantially along direction C (shown in FIG. 4). FIG. 6 shows a second cross-sectional view of the processor element 200 as viewed substantially along direction D (shown in FIG. 4). Features shown in dashed lines (for example features 114A, 114B, 108A and 108B of FIG. 5) are shown for indicative purposes only but are obstructed from view.

The example shown in FIGS. 4-6 differs from that shown in FIGS. 1-3 in that the first conductive via 124 comprises a metallic portion 126 mounted upon a polysilicon portion 128. As in the example of FIGS. 1-3, the metallic portion 126 has an interface end closest to the dielectric layer 104 (i.e. in contact with the polysilicon portion 128 in this example) and a distal portion (not shown). There is a taper between the interface end and the distal end of the metallic portion such that the cross-sectional area of the metallic portion 126 at the distal end is greater than the cross-sectional area of the metallic portion 126 at the interface end. The cross-sectional area of the metallic portion 126 at the interface end is less than or equal to 80 nm by 80 nm.

The processor element 200 of FIGS. 4-6 further differs from the processor element 100 of FIGS. 1-3 in that the second conductive via 130 comprises a second metallic portion 132 mounted upon a second polysilicon portion 134. As in the processor element 100 of FIGS. 1-3, the metallic portion 132 has an interface end closest to the dielectric layer 104 (i.e. in contact with the second polysilicon portion 134 in this example) and a distal portion (not shown). There is a taper between the interface end and the distal end of the second metallic portion 132 such that the cross-sectional area of the second metallic portion 132 at the distal end is greater than the cross-sectional area of the second metallic portion 132 at the interface end. The cross-sectional area of the metallic portion 132 at the interface end is less than or equal to 80 nm by 80 nm.

The second processor element 200 can be produced in part by providing a single polysilicon layer and then etching the polysilicon layer to define distinct electrodes 106A and 106B and the polysilicon portions 128 and 134 of the conductive vias.

Figure 7:
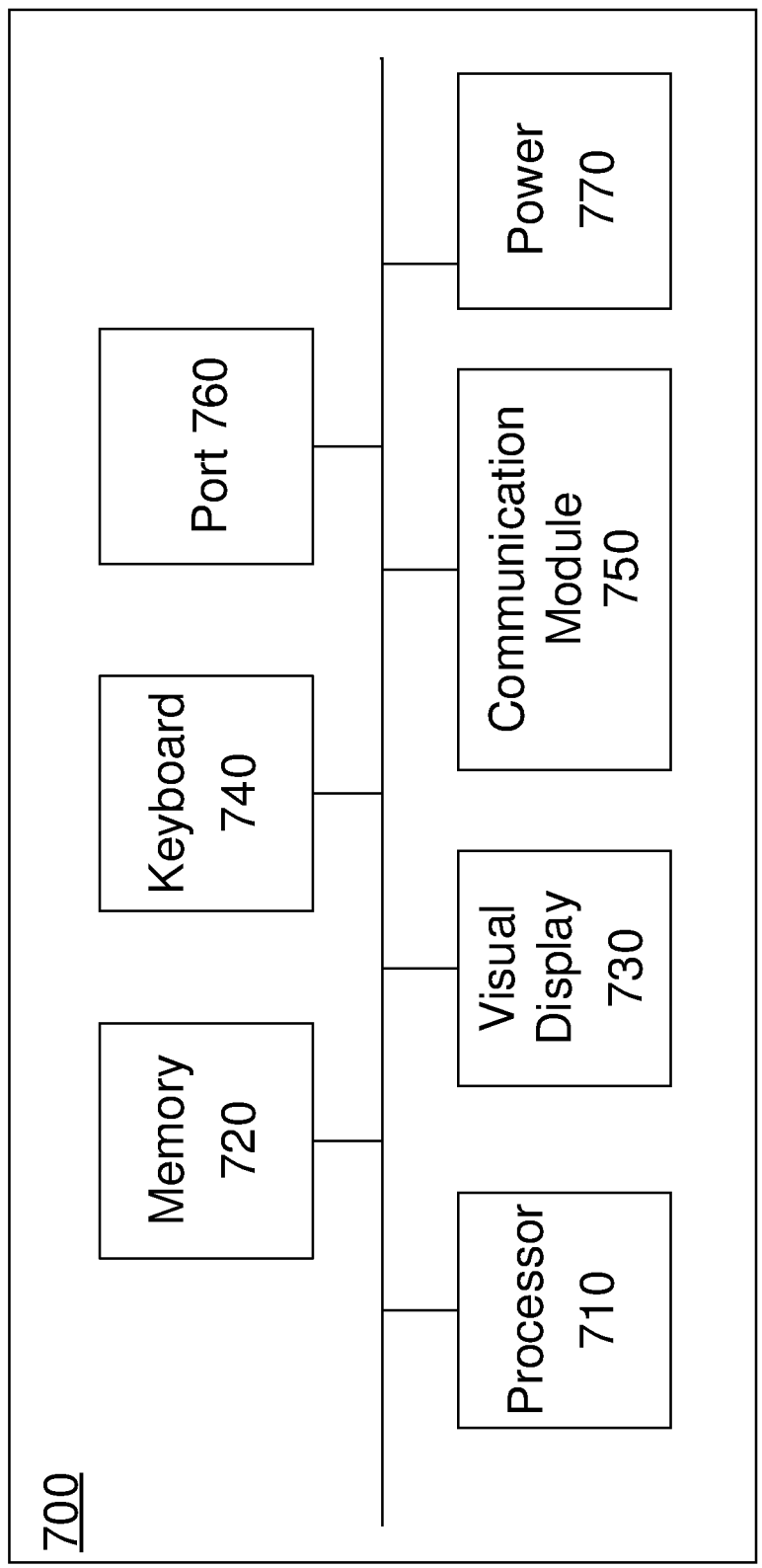
FIG. 7 shows a controller for operating one or more processor elements as described herein.

FIG. 7 is a block diagram of a (classical) controller/computing apparatus 700 for operating a quantum processor comprising one or more processor elements such as processor elements 100 and 200 described above. For example, computing apparatus 700 may comprise a computing device. Computing apparatus 700 may be distributed across multiple connected devices. Other architectures to that shown in FIG. 7 may be used as will be appreciated by the skilled person.

Referring to the figure, controller/computing apparatus 700 includes one or more (classical) processors 710, one or more memories 720, a number of optional user interfaces such as visual display 730 and virtual or physical keyboard 740, a communications module 750, and optionally a port 760 and optionally a power source 770. Each of components 710, 720, 730, 740, 750, 760, and 770 are interconnected using various busses. Classical processor 710 can process instructions for execution within the computing apparatus 700, including instructions stored in memory 720, received via communications module 750, or via port 760.

Memory 720 is for storing data within computing apparatus 700. The one or more memories 720 may include a volatile memory unit or units. The one or more memories may include a non-volatile memory unit or units. The one or more memories 720 may also be another form of computer-readable medium, such as a magnetic or optical disk. One or more memories 720 may provide mass storage for the computing apparatus 700. Instructions for performing a method as described herein may be stored within the one or more memories 720.

The apparatus 700 includes a number of user interfaces including visualising means such as a visual display 730 and a virtual or dedicated user input device such as keyboard 740.

The communications module 750 is suitable for sending and receiving communications between processor 710 and remote systems. For example, communications module 750 may be used to send and receive communications via a communication network such as the Internet.

The port 760 is suitable for receiving, for example, a non-transitory computer readable medium containing instruction to be processed by the processor 710.

The processor 710 is configured to receive data, access the memory 720, and to act upon instructions received either from said memory 720 or a computer-readable storage medium connected to port 760, from communications module 750 or from user input device 740.

With reference to the processor element 100 of FIGS. 1-3 (although this is equally applicable to the processor element 200 of FIGS. 4-6), the classical processor 710 of FIG. 7 is configured to apply a bias potential to the distal end of the conductive via 109 of processor element 100 in order to induce a quantum dot 118 at the interface between the dielectric layer 104 and the silicon layer 110. The processor 710 may is further configured to apply potentials to vias 108A and 108B to control the gate potentials of polysilicon electrodes 106A and 106B, thereby further defining the confinement region 118 in the silicon layer 110.

The processor 710 is further configured to apply a bias potential to the distal end of the second conductive via 122 of processor element 100 in order to induce a second quantum dot 120 at the second interface between the dielectric layer 104 and the silicon layer 110, the second quantum dot 120 for confining one or more electrons or holes in the silicon layer.

The processor 710 may further be configured to apply a voltage between source and drain electrodes of the processor element 100. As described above, the drain-source voltage may be used to read out a logical state of any spin qubit stored in the second quantum dot 120. The processor 710 may further be configured to manipulate a logic state of a qubit confined within the second quantum dot by manipulating a state of electrons or holes confined in the SET island 118.

Figure 8:
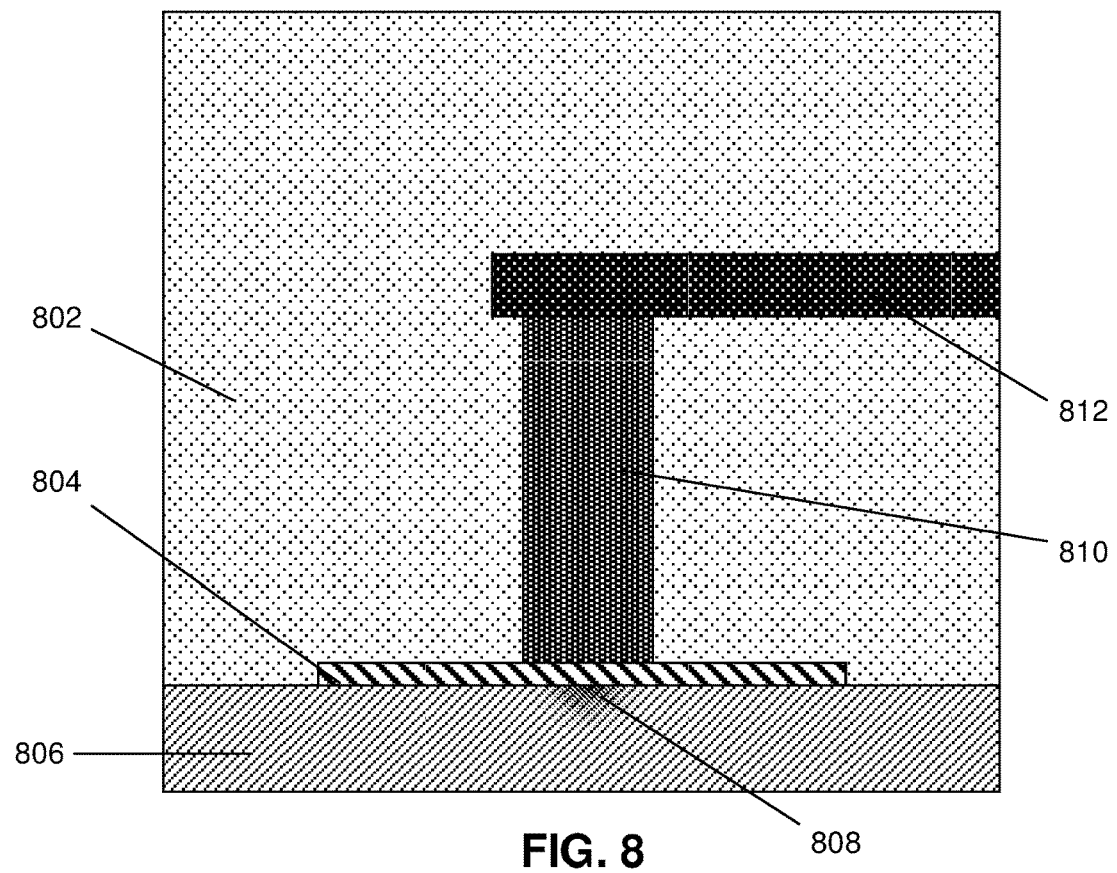
FIG. 8 illustrates a processor element.

FIG. 8 illustrates a processor element. Similar to processor element 100 and processor element 200, the processor element of FIG. 8 comprises a silicon layer 806 and a dielectric layer 804 disposed upon and forming an interface with the silicon layer 806. The processor element further comprises a conductive via 810, in this example a tungsten via, in contact with the dielectric layer 804. There is no salicide between the conductive via 810 and the dielectric layer 804. The conductive via 810 comprises has an interface end in contact with the dielectric layer 804. The distal end of the conductive via 810 is in this example in contact with a metal electrode 812 which in turn may be controlled, for example by apparatus 700 of FIG. 7, to apply a potential to the conductive via 810. In use, the application of a bias potential to the conductive via induces a quantum dot 808 at the interface between the dielectric layer 804 and the silicon layer 806, the quantum dot 808 for confining one or more electrons or holes in the silicon layer 806. The processor element further comprises further dielectric material 802 around the conductive via.

Figure 9:
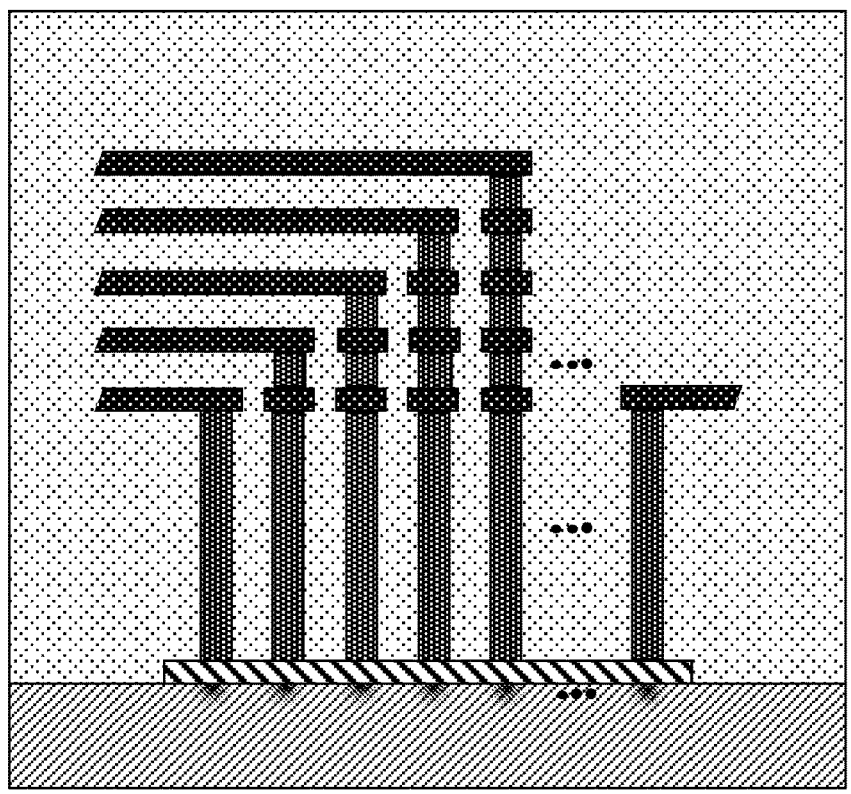
FIG. 9 illustrates an array of processor elements.

FIG. 9 illustrates an array of such processor elements. In particular, several conductive vias are shown forming a one-dimensional array of conductive vias, each arranged to form a quantum dot in the silicon layer. The quantum dots may be separated by a distance of, for example, 60 nm or less. The metallic electrodes for controlling bias potentials applied to the conductive vias of the array are each at different heights along the vertical axis. A two-dimensional array may also be formed of such processor elements. A processor may comprise an array of processor elements.

Variations of the described embodiments are envisaged. For example, the features of all the disclosed embodiments may be combined in any way. For example, an array may comprise several processor elements according to the embodiments shown in FIGS. 1-3 and/or 4-6 and/or 8. A processor may comprise an array of several processor elements.

As an example, the distances between the different features of the processor element may be different. For example, the polysilicon gate electrodes 106A, 106B are separated from each other by a distance of approximately 125 nm. The polysilicon gate electrodes 106A, 106B are separated from each other by a distance of approximately 145 nm. The polysilicon gate electrodes 106A, 106B are separated from each other by a distance of approximately 185 nm.

The first and second metallic vias 109, 122 are located close to one another, and may be separated, at the $SiO_2$ layer 104, by a distance of around 60 nm or around 40 nm.

It will be appreciated that the various methods described herein, or at least aspects thereof, may be implemented by a computer program. The computer program may include computer code arranged to instruct a computer to perform the functions of one or more of the various methods described above. The computer program and/or the code for performing such methods may be provided to an apparatus, such as a computer, on a computer-readable medium or computer program product. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid state memory, magnetic tape, a removable computer diskette, a random access memory (RAM), a read-only memory (ROM), a rigid magnetic disk, and an optical disk, such as a CD-ROM, CD-R/W or DVD.

An apparatus such as a computer may be configured in accordance with such code to perform one or more processes in accordance with the various methods discussed herein. Such an apparatus may take the form of a data processing system. Such a data processing system may be a distributed system. For example, such a data processing system may be distributed across a network.

The above embodiments have been described by way of example only, and the described embodiments are to be considered in all respects only as illustrative and not restrictive. It will be appreciated that variations of the described embodiments may be made without departing from the scope of the invention.

The invention claimed is:

1. A processor element, the processor element comprising:
    a silicon layer;
    a dielectric layer disposed upon and forming an interface with the silicon layer;
    a conductive via in contact with the dielectric layer, the conductive via comprising a metallic portion having an interface end in contact with the dielectric layer and a distal end;
    a second conductive via in contact with the dielectric layer, the second conductive via comprising a second metallic portion having an interface end in contact with the dielectric layer and a distal end;
    a source electrode;
    a drain electrode; and
    two polysilicon gate electrodes;
    wherein a cross-sectional area of the interface end of the metallic portion of the conductive via is less than or equal to 100 nm by 100 nm and a cross-sectional area of the interface end of the second metallic portion of the second conductive via is less than or equal to 100 nm by 100 nm;

wherein the conductive via is electrically connected such that the application of a bias potential to the distal end of the conductive via induces a quantum dot at the interface between the dielectric layer and the silicon layer, the quantum dot for confining one or more electrons or holes in the silicon layer;

wherein the second conductive via is electrically connected such that the application of a bias potential to the distal end of the second conductive via induces a second quantum dot at the second interface between the dielectric layer and the silicon layer, the second quantum dot for confining an electron or a hole in the silicon layer;

wherein the quantum dot provides a single electron transistor, SET, island formed in the silicon layer between tunnelling junctions connected to the source and the drain electrodes, wherein the tunnelling between the SET island and the source and drain electrodes is controlled by the potentials applied to the two polysilicon gate electrodes;

wherein the quantum dot and the second quantum dot are proximally located and separated by a quantum tunnelling barrier; and wherein the second quantum dot is for confining an electron or a hole for use as a qubit.

2. The processor element according to claim 1, wherein the conductive via is a wholly metallic via.

3. The processor element according to claim 1, wherein the metallic portion of the conductive via has a taper such that a cross-sectional area of the metal portion is greater at the distal end than at the interface end.

4. The processor element according to claim 1, wherein, in use, the application of a bias potential to a distal end of the conductive via confines a single electron to the quantum dot.

5. The processor element according to claim 1, wherein the second conductive via is a wholly metallic via.

6. The processor element according to claim 1, wherein the second metallic portion of the second conductive via has a taper such that a cross-sectional area of the second metallic portion is greater at the distal end than at the interface end.

7. The processor element according to claim 1, wherein the quantum dot is separated from the second quantum dot by a distance of less than or equal to 60 nm.

8. The processor comprising a plurality of processor elements according to claim 1.

9. A method of operation of a processor element, the quantum processor element comprising:
  a silicon layer;
  a dielectric layer disposed upon and forming an interface with the silicon layer;
  a conductive via in contact with the dielectric layer, the conductive via comprising a metallic portion having an interface end in contact with the dielectric layer and a distal end;
  a second conductive via in contact with the dielectric layer, the second conductive via comprising a second metallic portion having an interface end in contact with the dielectric layer and a distal end;
  a source electrode;
  a drain electrode; and
  two polysilicon gate electrodes;
  wherein a cross-sectional area of the interface end of the metallic portion of the conductive via is less than or equal to 100 nm by 100 nm and a cross-sectional area of the interface end of the second metallic portion of the second conductive via is less than or equal to 100 nm by 100 nm;
  wherein, in use, the application of a bias potential to the distal end of the conductive via induces a quantum dot at the interface between the dielectric layer and the silicon layer, the quantum dot for confining one or more electrons or holes in the silicon layer, and the application of a bias potential to the distal end of the second conductive via induces a second quantum dot at the second interface between the dielectric layer and the silicon layer, the second quantum dot for confining an electron or a hole in the silicon layer;
  wherein the quantum dot is a single electron transistor, SET, island formed in the silicon layer between tunnelling junctions connected to the source and the drain electrodes, wherein the tunnelling between the SET island and the source and drain electrodes is controlled by the potentials applied to the two polysilicon gate electrodes;
  wherein the quantum dot and the second quantum dot are proximally located and separated by a quantum tunnelling barrier; and
  wherein the second quantum dot is for confining an electron or a hole for use as a qubit, the method comprising:
    applying a bias potential to a distal end of the metallic portion of the conductive via to confine a single electron or hole in the quantum dot; and
    applying a bias potential to a distal end of the second metallic portion of the second conductive via to confine a single electron or hole in the second quantum dot.

10. The method according to claim 9, further comprising manipulating a logic state of a qubit confined within the second quantum dot by manipulating a state of electrons or holes confined in the SET island.

* * * * *